United States Patent [19]

Malloy et al.

[11] Patent Number: 5,455,202
[45] Date of Patent: Oct. 3, 1995

[54] METHOD OF MAKING A MICROELECTRIC DEVICE USING AN ALTERNATE SUBSTRATE

[75] Inventors: Gerard T. Malloy, Oceanside; Joseph J. Bendik, Carlsbad, both of Calif.

[73] Assignee: Hughes Aircraft Company, Los Angeles, Calif.

[21] Appl. No.: 6,119

[22] Filed: Jan. 19, 1993

[51] Int. Cl.[6] .................................................. H01L 21/465
[52] U.S. Cl. .................. 437/228; 437/974; 148/DIG. 12
[58] Field of Search ........................... 148/DIG. 12, 135; 437/974, 62, 86, 228

[56] References Cited

U.S. PATENT DOCUMENTS

| | | | |
|---|---|---|---|
| 3,918,148 | 11/1975 | Magdo et al. | 29/576 |
| 3,959,045 | 5/1976 | Antypas | 156/3 |
| 5,013,681 | 5/1991 | Codbey et al. | 437/86 |
| 5,102,821 | 4/1992 | Moslehi | 437/62 |
| 5,110,748 | 5/1992 | Sarma | 437/51 |
| 5,147,808 | 9/1992 | Pronko | 437/21 |
| 5,213,986 | 5/1993 | Pinker et al. | 437/20 |
| 5,240,876 | 8/1993 | Gaul et al. | 437/131 |

FOREIGN PATENT DOCUMENTS 0417851  3/1991  European Pat. Off. ............ 921/978

OTHER PUBLICATIONS

Haisma, J. et al., "Silicon–on–Insulator Wafer Bonding-Wafer Thinning Technological Evaluations", Japan Jour. App. Phy. 28(8), 1989.

Kimura et al, "Epitaxial film transfer technique for producing single crystal Si film on an insulating substrate" Applied Physics Letters 43(3), May 1983.

Grupen–Shemasky et al., "Stress in GaAs bonded to Si", Proceedings of the First International Symposium on Semiconductor Wafer Bonding; Science, Technology and Applications, Oct. 13–18, 1991.

Primary Examiner—Olik Chaudhuri
Assistant Examiner—Richard A. Booth
Attorney, Agent, or Firm—W. C. Schubert; W. K. Denson-Low

[57] ABSTRACT

A microelectronic device is fabricated on a first substrate (40), and transferred to a second substrate (58). The first substrate (40) has a silicon etchable layer (42), a silicon dioxide etch-stop layer (44) overlying the etchable layer (42), and a single-crystal wafer (46) overlying the etch-stop layer (44). A microelectronic circuit element (48) is formed in the wafer (46) of the first substrate (40). The wafer (46) of the first substrate (40) is attached to an aluminum oxide temporary substrate (52), and the etchable layer (42) of the first substrate (40) is etched away down to the etch-stop layer (44) to leave a primary device structure. The etch-stop layer (44) may optionally be processed to remove all or a part of the layer. An exposed surface (56) of the primary device structure is fixed to the second substrate (58), and the temporary substrate (52) is removed.

8 Claims, 1 Drawing Sheet

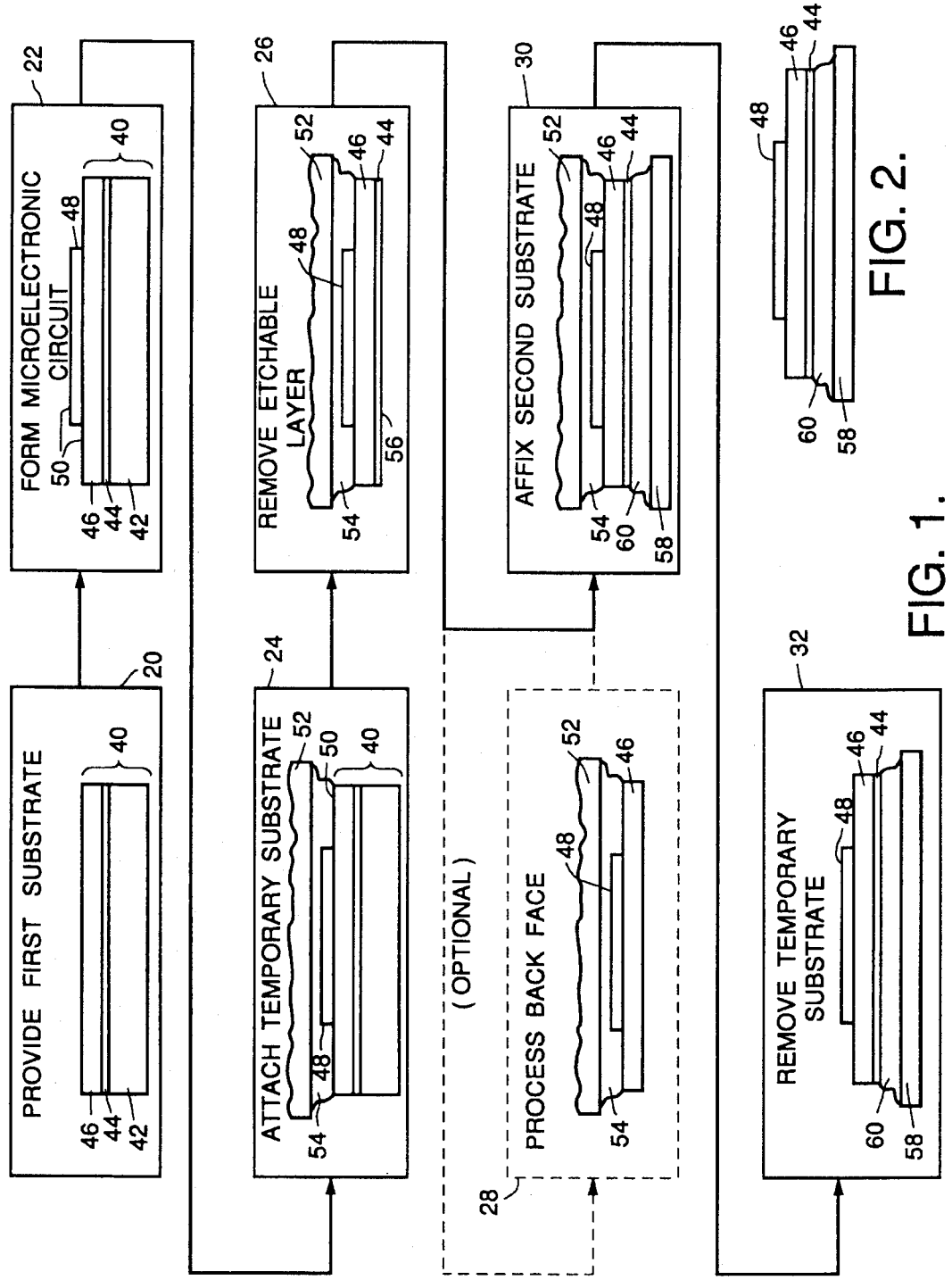

METHOD OF MAKING A MICROELECTRIC DEVICE USING AN ALTERNATE SUBSTRATE

BACKGROUND OF THE INVENTION

This invention relates to microelectronic devices, and, more particularly, to such a device moved from one substrate to another during fabrication.

Thin-film microelectronic devices are fabricated on a substrate, typically a thin piece of a single-crystal material such as silicon. The microelectronic circuitry is formed in the substrate by a combination of steps such as deposition, implantation, film growth, etching, and patterning. In these steps, patterned layers of metals, semiconductors, and insulators are created on or near the surface of the substrate with the physical arrangements, interfaces, and structures required for individual circuit components and the electrical leads that extend between them.

The substrate performs important roles in the fabrication and use of the microelectronic device. The lattice matching between the substrate and the layer deposited upon the substrate strongly influences the structure, orientation, and operability of that layer in the device. The chemical composition (i.e., doping) of the substrate can also play a major role in the operability of the device.

Microelectronic devices are normally assembled together with other components into higher-level structures and packages. The substrate used for the microelectronic device also plays an important role in product performance after the subsequent assembly of the device into such higher-level products. These complex electronic structures are often heated and cooled during storage and service. For example, sensors often must be operated at cryogenic temperatures, necessitating the cooling of the final assembled structure of sensor element and electronic device to such low temperatures. If the substrate of a particular microelectronic device has a substantially different coefficient of thermal expansion than other structure s with which it is assembled to make the final product, thermal expansion stresses and strains are created. If the thermal expansion mismatch is too large, the thermal stresses and strains may adversely affect the operation of the microelectronic device, and, in the extreme case, cause a mechanical failure of the structure.

A great deal of effort has been devoted to selecting combinations of materials and structures that permit fabrication of microelectronic circuitry having the required structure and electronic performance In the fabricated microelectronic device, and at the same time minimize adverse effects of thermal expansion mismatch in the final structure. This search for operable combinations is limited by the available materials provided by nature. In some instances suitable combinations simply have not been found, or the best available combinations are only marginally acceptable.

There remains a need for further improvements in the fabrication of microelectronic devices, with specific reference to these problems of fabricability and subsequent performance of the devices. The present invention fulfills this need, and further provides related advantages.

SUMMARY OF THE INVENTION

The present invention provides a technique for fabricating a microelectronic device utilizing a first substrate for fabrication compatibility purposes, and a second substrate for service thermal expansion compatibility purposes or other reasons. The microelectronic recruit element is fabricated in the first substrate, and moved to the second substrate during the fabrication process. This approach permits the microelectronic device to be fabricated in an optimal manner, and thereafter assembled and used in an optimal manner. The selected substrates are those which are known to individually provide good fabrication and service performance, respectively.

In accordance with the invention, a method of fabricating a microelectronic device includes the step of furnishing a first substrate having an etchable layer, an etch-stop layer overlying the etchable layer, and a wafer overlying the etch-stop layer and having a front exposed surface. A microelectronic circuit element is formed in the wafer of the first substrate, and the front exposed surface of tile structure is attached to a temporary substrate. The etchable layer of the first substrate is etched away, preferably with a liquid etchant, down to the etch-stop layer to leave a primary device structure. Optionally, all or a portion of the etch-stop layer may be removed by other techniques, as may be required for the specific type of device, and other intermediate processing can be performed. The method further includes furnishing a second substrate and fixing an exposed surface of the primary device structure remote from the temporary substrate to the second substrate. Finally, the temporary substrate is removed from contact with the front exposed surface. The remaining device, supported on the second substrate rather than the original etchable layer, is then ready for further processing or assembly with other components.

In a preferred embodiment, the first substrate is a silicon-based technology, and the second substrate is a gallium arsenide-based material or an aluminum oxide-based material. In this case, the first substrate has a bulk silicon etchable layer, a silicon dioxide etch-stop layer, and a single crystal silicon wafer layer. The etchable layer is removed with hot potassium hydroxide or sodium hydroxide solution. The second substrate, gallium arsenide, is affixed to the primary device structure with an epoxy.

The present approach is based upon the ability to transfer a thin film microelectronic circuit element or device from one substrate structure (more specifically, the etchable layer of the first substrate) to another substrate. The circuit element is fabricated in the wafer of the first substrate, whose etchable portion provides support during initial fabrication and handling, and is selected for compatibility with device fabrication. The active microelectronic device remains in the original wafer material during service. However, the etchable layer present during device fabrication may not be the most compatible choice for service applications of the device. The second substrate is selected to replace the etchable layer of the first substrate with service requirements in mind, and the device circuit element is transferred to this second substrate.

The present invention thus provides an important advance in the art of microelectronic device fabrication. A single device substrate need no longer be chosen as a compromise between fabrication and service requirements. Instead, the first substrate is selected for optimal fabrication characteristics, the second substrate is selected for optimal service characteristics, and the device is transferred to the second substrate during the fabrication process.

Other features and advantages of the present invention will be apparent from the following more detailed description of the preferred embodiment, taken in conjunction with the accompanying drawings, which illustrate, by way of

BRIEF DESCRIPTION OF THE DRAWINGS

FIG. 1 is a diagrammatic process flow diagram for the approach of the invention, with the structure at each stage of fabrication indicated schematically; and FIG. 2 is a schematic side sectional view of a microelectronic device structure prepared according to the invention.

DETAILED DESCRIPTION OF THE INVENTION

Referring to FIG. 1, the present invention is practiced by first providing a first substrate 40, numeral 20. The first substrate 40 includes an etchable layer 42, an etch-stop layer 44 grown upon and overlying the etchable layer 42, and a wafer layer 46 bonded to and overlying the etch-stop layer 44. Such substrates can be purchased commercially.

In the preferred practice, the etchable layer 42 is a layer of bulk silicon about 500 micrometers thick and the etch-stop layer 44 is a layer of silicon dioxide about 1 micrometer thick. The wafer layer 46 is normally thicker than required when it is bonded to the etch stop layer 44 and is thinned to the required final thickness. A typical thinning process involves lapping followed by a them mechanical polish. Preferably, the wafer layer 46 is a layer of single crystal silicon initially about 500 micrometers thick which becomes, after thinning, about 30 nanometers to 50 micrometers thick. These dimensions are not critical, and may be varied as necessary for particular applications. (The structure depictions in FIGS. 1–2 are not drawn to scale.) The wafer layer 46 may also be or include an interconnect material such as a metal or other structure as may be appropriate for a particular application.

The first substrate 40 is prepared by applying well-known microelectronic techniques. The silicon dioxide etch-stop layer 44 is produced on a bulk silicon piece 42 by heating it in an oxygen-hydrogen atmosphere at a temperature of about 1100° C. for a time sufficient to achieve the desired thickness, typically about 2 hours. The wafer layer 46 is either deposited directly upon the etch-stop layer 44 or fabricated separately and bonded to the etch-stop layer 46 by direct interdiffusion, preferably the latter, and thinned using standard techniques. (All references herein to "standard" or "well known" techniques, or the like, mean that individual process steps are known generally, not that they are known in the present context or combination, or to produce the present type of structure.)

A microelectronic circuit element 48 is formed in the wafer layer 46, numeral 22, working from a front exposed side 50. The microelectronic circuit element 48 may be of any type, and may itself include multiple layers of metals, semiconductors, insulators, etc. Any combination of steps can be used, including, for example, deposition, implantation, film growth, etching, and patterning steps. As used herein, the term "microelectronic circuit element" is interpreted broadly, and can include active devices and passive structure. For example, the microelectronic circuit element 48 can include active devices such as transistors. Alternatively, it may be simply a patterned electrical conductor layer that is used as an interconnect between other layers of structure, or it may be a sensor element.

An important virtue of the present invention is that it is operable with a wide range of microelectronic circuit elements 48, and therefore the present invention is not limited to any particular circuit element 48. In the presently preferred case, the first substrate 40 is silicon based, and therefore the microelectronic circuit element 48 is preferably a silicon-based device. Where the microelectronic circuit element 48 is based upon other material systems, it may be preferred for the first substrate to be made of a material compatible to that material system. In this usage, "compatible" means that the first substrate permits fabrication of the microelectronic circuit element 48 therein.

A temporary substrate 52 is attached to the first substrate 40 and deposited microelectronic circuit element 48, on their front exposed side 50, numeral 24. The temporary substrate 52 is used during the fabrication operation as a grasping and supporting aid and to protect the microelectronic circuit element 48 from damage during subsequent processing.

The temporary substrate 52 is removed prior to completion of the fabrication operation. It is therefore not required to have a particular electronic functional relation with the circuit element 48. It need only be resistant to the etching procedures utilized in the next step. In the preferred case, the temporary substrate 52 is aluminum oxide, most preferably sapphire. The temporary substrate attached with a removable material layer 54 that softens when heated and resists damage in contact with the etchant. The removable material layer 54 is preferably a waxy substance such as glycol phthalate.

The etchable layer 42 of the first substrate 40 is removed by an appropriate technique, preferably by etching, numeral 26. The etchant is preferably a liquid composition chosen so that it attacks the etchable layer 42 but not the etch-stop layer 44. The terms "etchable" and "etch-stop" are used herein relative to a specific selected etchant. There is chosen an etchant that readily etches the etchable layer but has a much lower (preferably near-zero) etching rate for the etch-stop layer. It is understood, however, that all or a portion of the etch-stop layer may be generally or selectively removed by yet other techniques, if desired, after the etchable layer is removed.

Thus, the preferred bulk silicon etchable layer 42 is attacked and etched away by a 5–10 molar potassium hydroxide (KOH) or sodium hydroxide (NaOH) etchant solution at a temperature of 60° C., but the silicon dioxide etch-stop layer 44 is barely attacked by the etchant. In a typical case, a 500 micrometer thick silicon etchable layer 42 is removed by etching in the potassium hydroxide solution for 20 hours. The etch-stop silicon dioxide layer 44 is not attacked at a substantial rate by these etchant solutions.

When the etchable layer 42 is exposed to the etchant, bubbles evolve as the silicon reacts and etches away. The end point of the bulk etching is determined by the end of the bubble evolution and the appearance of the glassy silicon dioxide etch-stop layer 44. At the completion of etching, numeral a back face 56 of the etch-stop layer 44 is exposed. The back face 56 and remainder of the structure are rinsed in deionized water.

At this point, the back face 56 may be processed in a manner consistent with the nature of the final device, numeral 28. In some instances, the back face 56 is left as-is, with no changes so that the complete etch-stop layer 44 remains. In other instances, all or part of the etch-stop layer 44 may be removed. (This step is optional, and is indicated in dashed lines in FIG. 1. The remaining steps of FIG. 1 assume that the optional step 28 is not performed.) In this latter case, the etch-stop layer 44 is selectively removed either by a dry etch procedure such as plasma etching, or using a conventional silicon dioxide etch such as a buffered mixture of hydrofluoric acid and ammonium fluoride.

A second substrate 58 is affixed to the back face 56, numeral 30, to replace the etchable layer 42 that has been removed. The second substrate 58 is selected for compatibility with subsequent use requirements, such as, for example, good thermal cycling compatibility with other elements of structure during service. The service compatibility is often not fully consistent with the requirements of the first substrate that is used for fabrication of the microelectronic circuit element 48, and therefore a different material is substituted for the (removed) etchable layer 42 as the second substrate 58.

In the present case, the material chosen for the second substrate is preferably aluminum oxide such as sapphire or a semiconductor such as gallium arsenide (GaAs), for better compatibility in a thermal cycling environment where the final assembled structure is heated and cooled during service. In this regard, it must be remembered that the structure produced according to the present invention is normally assembled with other devices, structures, supports, etc., to form a final product. The material of the second substrate 58 may be chosen primarily for compatibility with the overall requirements of this final product.

Preferably, the second substrate 58 is mechanically affixed using a thin affixing layer 60 of a room-temperature curing epoxy. Such epoxies are available commercially, an example being 3M Type 2216 epoxy. A room-temperature curing epoxy is used because, if the assembly were heated to cure the epoxy, the wax of the layer 54 would likely be softened or melted and the microelectronic circuit element 48 could deform or crack. To perform the affixing operation, the affixing layer 60 of uncured epoxy is spread over the surface of the second substrate 58 and cured. The layer 60 is preferably outgassed in a vacuum chamber before and during curing.

The back face 56 is thereafter contacted to the second substrate 58 with the affixing layer 60 therebetween, and optionally outgassed further. This assembly is placed into a precision laminating press and pressed at a pressure of from about 100 to about 600 psi for a period of from about 4 to about 24 hours. The thickness of the layer 60 may play a role in the performance of the final product. The thickness may be varied by changing the combination of pressing pressure and time. The thickness may also be varied by applying the epoxy material and then delaying the pressing for a period of time, to permit the epoxy to partially cure and therefore be less deformable during the pressing operation.

The temporary substrate 52 is removed, numeral 32. In the case described, the waxy layer 54 of removable material is melted by placing the assembly onto a hot plate, a tool is inserted between the temporary substrate 52 and the wafer layer 46, and the pieces 52 and 46/48 are popped apart. Residual wax is removed with a solvent such as acetone in the case of glycol phthalate. Any other material remaining on the structure can be removed with appropriate solvents. The structure as shown in FIG. 2 is then ready for subsequent processing as appropriate. Such processing can include attachment of leads to the circuit element 48, dicing if more than one circuit element was fabricated, assembly with other components to form more-complex products, etc.

The present invention has been practiced using the approach described above, to fabricate a sensor readout structure for an infrared sensor system. In this sensor readout device, the circuit element 48 was a silicon-based microelectronic circuit fabricated in a silicon wafer 46. The etchable layer 42 was silicon, and the etch-stop layer 44 was silicon dioxide. The etchable layer 42 was etched away, down to the silicon dioxide etch-stop layer 44. The second substrate 58, either aluminum oxide or gallium arsenide, was attached with an epoxy affixing layer 60. The sensor readout structure was mechanically attached and electrically connected to a detector structure. The detector included a layer of Hg—Cd—Te (mercury-cadmium-tellurium) on a Cd—Zn—Te (cadmium-zinc-tellurium) substrate. This device, operated in service at cryogenic temperatures, has been found to be more resistant to thermal excursion and cycling damage than a conventionally structured device.

Although a particular embodiment of the invention has been described in detail for purposes of illustration, various modifications may be made without departing from the spirit and scope of the invention. Accordingly, the invention is not to be limited except as by the appended claims.

What is claimed is:

1. A method of fabricating a microelectronic device, comprising the steps of:

furnishing a first substrate having a silicon etchable layer, a silicon dioxide etch-stop layer overlying the etchable layer, and a silicon wafer overlying the etch-stop layer and having a front exposed surface;

forming a microelectronic circuit element in the wafer of the first substrate;

attaching the front exposed surface of the wafer portion of the first substrate to a temporary substrate;

etching away the etchable layer of the first substrate down to the etch-stop layer to leave a primary device structure;

furnishing a second substrate made of a material selected from the group consisting of aluminum oxide and gallium arsenide;

fixing an exposed surface of the primary device structure remote from the temporary substrate to the second substrate; and removing the temporary substrate from contact with the front exposed surface.

2. The method of claim 1, wherein the step of etching away includes the step of contacting the etchable layer with a liquid etchant.

3. The method of claim 2, wherein the etchant is selected from the group consisting of aqueous potassium hydroxide solution and aqueous sodium hydroxide solution.

4. The method of claim 1, wherein the step of fixing includes the step of placing a layer of epoxy between the second substrate and the primary device structure, and degassing and curing the epoxy.

5. The method of claim 1, wherein the silicon etchable layer of the first substrate is about 500 micrometers in thickness, the silicon dioxide etch-stop layer of the first substrate is about 1 micrometer in thickness, and the wafer of the first substrate is from about 30 nanometers to about 50 micrometers in thickness.

6. The method of claim 1, wherein the wafer is a single crystal.

7. The method of claim 1, including the additional step, after the step of etching away and before the step of fixing, of processing the etch-stop layer to remove at least a portion of the etch-stop layer.

8. The method of claim 7, wherein the step of processing includes the step of removing the etch-stop layer.

\* \* \* \* \*